(12) United States Patent
Emerson et al.

(10) Patent No.: US 12,050,112 B2
(45) Date of Patent: *Jul. 30, 2024

(54) DISTANCE MEASUREMENT BETWEEN GAS DISTRIBUTION DEVICE AND SUBSTRATE SUPPORT AT HIGH TEMPERATURES

(71) Applicant: LAM RESEARCH CORPORATION, Fremont, CA (US)

(72) Inventors: Mark E. Emerson, Newberg, OR (US); Nick Ray Linebarger, Jr., Beaverton, OR (US)

(73) Assignee: LAM RESEARCH CORPORATION, Fremont, CA (US)

(*) Notice: Subject to any disclaimer, the term of this patent is extended or adjusted under 35 U.S.C. 154(b) by 34 days.

This patent is subject to a terminal disclaimer.

(21) Appl. No.: 17/877,170

(22) Filed: Jul. 29, 2022

(65) Prior Publication Data

US 2022/0364858 A1 Nov. 17, 2022

Related U.S. Application Data

(63) Continuation of application No. 16/238,891, filed on Jan. 3, 2019, now Pat. No. 11,408,734.

(51) Int. Cl.
*G01B 11/24* (2006.01)
*C23C 16/52* (2006.01)
*G01C 3/12* (2006.01)

(52) U.S. Cl.
CPC ............... *G01C 3/12* (2013.01); *C23C 16/52* (2013.01)

(58) Field of Classification Search
CPC ............. G01C 3/12; G01C 3/14; G01B 11/14
(Continued)

(56) References Cited

U.S. PATENT DOCUMENTS 6,210,754 B1 4/2001 Lu et al.
7,746,448 B2 6/2010 Franitza et al.
(Continued)

FOREIGN PATENT DOCUMENTS

KR 101542352 B1 8/2015
TW 201346061 A 11/2013
(Continued)

OTHER PUBLICATIONS

International Search Report and Written Opinion for PCT Application No. PCT/US2019/068712 dated Apr. 29, 2020.
(Continued)

*Primary Examiner* — George B Bennett

(57) ABSTRACT

A substrate processing system includes a laser triangulation sensor configured to transmit and receive light through a window of an exterior wall of a substrate processing chamber. A controller is configured to: position the laser triangulation sensor such that the laser triangulation sensor transmits light onto a measurement feature arranged between a first surface of a substrate support and a second surface of a gas distribution device, where the second surface faces the first surface; and while the laser triangulation sensor transmits light onto the measurement feature, determine a first distance between the first and second surfaces based on a difference between: a second distance between the laser triangulation sensor and the first surface measured using the laser triangulation sensor; and a third distance between the laser triangulation sensor and the second surface measured using the laser triangulation sensor.

24 Claims, 11 Drawing Sheets

(58) Field of Classification Search
USPC .................................................. 33/228, 286
See application file for complete search history.

(56) References Cited

U.S. PATENT DOCUMENTS

| | | | |
|---|---|---|---|
| 8,590,167 | B2 | 11/2013 | Odom |
| 10,286,485 | B2 * | 5/2019 | Lee ........................ B23K 26/06 |
| 10,775,708 | B2 * | 9/2020 | Shibazaki ............... G03F 7/705 |
| 11,287,243 | B2 | 3/2022 | Srinivasan |
| 11,408,734 | B2 * | 8/2022 | Emerson ................. G01S 17/48 |
| 2013/0321811 | A1 | 12/2013 | Maeda et al. |
| 2016/0027675 | A1 | 1/2016 | Ravid et al. |
| 2018/0301322 | A1 | 10/2018 | Sugita et al. |
| 2019/0094013 | A1 | 3/2019 | Kondo et al. |
| 2020/0217657 | A1 | 7/2020 | Emerson et al. |
| 2020/0278194 | A1 | 9/2020 | Kawahito |
| 2021/0370088 | A1 | 12/2021 | Bergmann et al. |
| 2022/0082372 | A1 | 3/2022 | Monks et al. |
| 2023/0173608 | A1 * | 6/2023 | Gosselin ................ G05B 19/18 |
| | | | 700/28 |

FOREIGN PATENT DOCUMENTS

| | | |
|---|---|---|
| TW | 201610405 A | 3/2016 |
| WO | WO-2009091189 A2 | 7/2009 |

OTHER PUBLICATIONS

Taiwanese Ofice Action for Taiwanese Application No. 108148348 dated Nov. 14, 2023.

\* cited by examiner

DISTANCE MEASUREMENT BETWEEN GAS DISTRIBUTION DEVICE AND SUBSTRATE SUPPORT AT HIGH TEMPERATURES

CROSS-REFERENCE TO RELATED APPLICATIONS

The present disclosure is a continuation of U.S. patent application Ser. No. 16/238,891 filed on Jan. 3, 2019. The entire disclosure of the application referenced above is incorporated herein by reference.

FIELD

The present disclosure relates to substrate processing chambers and more particularly to systems and methods for measuring distances between a gas distribution device and a substrate support.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, chemical vapor deposition (CVD), atomic layer deposition (ALD), conductor etch, and/or other etch, deposition, or cleaning processes. A substrate may be arranged on a substrate support, such as a pedestal, an electrostatic chuck (ESC), etc. in a processing chamber of the substrate processing system.

The substrate support may include a ceramic layer arranged to support a substrate. For example, a wafer may be electrostatically clamped to the ceramic layer during processing.

SUMMARY

In a feature, a substrate processing system includes a laser triangulation sensor configured to transmit and receive light through a window of an exterior wall of a substrate processing chamber. A controller is configured to: position the laser triangulation sensor such that the laser triangulation sensor transmits light onto a measurement feature arranged between a first surface of a substrate support and a second surface of a gas distribution device, where the second surface faces the first surface; and while the laser triangulation sensor transmits light onto the measurement feature, determine a first distance between the first and second surfaces based on a difference between: a second distance between the laser triangulation sensor and the first surface measured using the laser triangulation sensor; and a third distance between the laser triangulation sensor and the second surface measured using the laser triangulation sensor.

In further features, the measurement feature is configured to: reflect light from the laser triangulation sensor onto the first surface when the laser triangulation sensor outputs light to a first surface of the measurement feature; and reflect light from the laser triangulation sensor onto the second surface when the laser triangulation sensor outputs light to a second surface of the measurement feature.

In further features, the measurement feature includes a knife edge prism including a mirror coating.

In further features, the controller is configured to increase a temperature within the substrate processing chamber greater than or equal to a predetermined processing temperature, where the controller is configured to position the laser triangulation sensor while the temperature is greater than or equal to the predetermined processing temperature.

In further features, the predetermined processing temperature is at least 80 degrees Celsius.

In further features: an adjustment mechanism is configured to raise and lower a portion of the gas distribution device.

In further features, the controller is configured to selectively actuate the adjustment mechanism based on the first distance.

In further features, the controller is configured to selectively actuate the adjustment mechanism to adjust the first distance toward a first target distance.

In further features, the controller is further configured to: position the laser triangulation sensor such that the laser triangulation sensor transmits light onto a second measurement feature arranged between the first surface of the substrate support and the second surface of the gas distribution device; and while the laser triangulation sensor transmits light onto the second measurement feature, determine a fourth distance between the first and second surfaces based on a second difference between: a fifth distance between the laser triangulation sensor and the first surface measured using the laser triangulation sensor; and a sixth distance between the laser triangulation sensor and the second surface measured using the laser triangulation sensor.

In further features, the controller is further configured to: position the laser triangulation sensor such that the laser triangulation sensor transmits light onto a third measurement feature arranged between the first surface of the substrate support and the second surface of the gas distribution device; and while the laser triangulation sensor transmits light onto the third measurement feature, determine a seventh distance between the first and second surfaces based on a third difference between: an eighth distance between the laser triangulation sensor and the first surface measured using the laser triangulation sensor; and a ninth distance between the laser triangulation sensor and the second surface measured using the laser triangulation sensor.

In further features: a first adjustment mechanism is configured to raise and lower a first point on the gas distribution device; a second adjustment mechanism is configured to, independently of the first adjustment mechanism, raise and lower a second point on the gas distribution device; and a third adjustment mechanism is configured to, independently of the first and second adjustment mechanisms, raise and lower a third point on the gas distribution device.

In further features, the controller is configured to selectively actuate at least one of the first, second, and third adjustment mechanisms based on at least one of the first, second, and third distances.

In a feature, a substrate processing method includes: by a laser triangulation sensor, transmitting and receiving light through a window of an exterior wall of a substrate processing chamber; positioning the laser triangulation sensor such that the laser triangulation sensor transmits light onto a measurement feature arranged between a first surface of a substrate support and a second surface of a gas distribution device, where the second surface faces the first surface; while the laser triangulation sensor transmits light onto the measurement feature, determining a first distance between the first and second surfaces based on a difference between: a second distance between the laser triangulation sensor and the first surface measured using the laser triangulation sensor; and a third distance between the laser triangulation sensor and the second surface measured using the laser triangulation sensor.

In further features, the substrate processing method further includes, by the measurement feature: reflecting light from the laser triangulation sensor onto the first surface when the laser triangulation sensor outputs light to a first surface of the measurement feature; and reflecting light from the laser triangulation sensor onto the second surface when the laser triangulation sensor outputs light to a second surface of the measurement feature.

In further features, the measurement feature includes a knife edge prism including a mirror coating.

In further features, the substrate processing method further includes increasing a temperature within the substrate processing chamber greater than or equal to a predetermined processing temperature, where the positioning includes positioning the laser triangulation sensor while the temperature is greater than or equal to the predetermined processing temperature.

In further features, the predetermined processing temperature is at least 80 degrees Celsius.

In further features, the substrate processing method further includes: raising and lowering a portion of the gas distribution device.

In further features, the raising and lowering includes at least one of raising and lowering the portion of the gas distribution device based on the first distance.

In further features, the raising and lowering includes at least one of raising and lowering the portion of the gas distribution device to adjust the first distance toward a first target distance.

In further features, the substrate processing method further includes: positioning the laser triangulation sensor such that the laser triangulation sensor transmits light onto a second measurement feature arranged between the first surface of the substrate support and the second surface of the gas distribution device; and while the laser triangulation sensor is transmitting light onto the second measurement feature, determining a fourth distance between the first and second surfaces based on a second difference between: a fifth distance between the laser triangulation sensor and the first surface measured using the laser triangulation sensor; and a sixth distance between the laser triangulation sensor and the second surface measured using the laser triangulation sensor.

In further features, the substrate processing method further includes: positioning the laser triangulation sensor such that the laser triangulation sensor transmits light onto a third measurement feature arranged between the first surface of the substrate support and the second surface of the gas distribution device; and while the laser triangulation sensor is transmitting light onto the third measurement feature, determine a seventh distance between the first and second surfaces based on a third difference between: an eighth distance between the laser triangulation sensor and the first surface measured using the laser triangulation sensor; and a ninth distance between the laser triangulation sensor and the second surface measured using the laser triangulation sensor.

In further features, the substrate processing method further includes: raising and lowering a first point on the gas distribution device; independently of the first point, raising and lowering a second point on the gas distribution device; and independently of the first and second points, raising and lowering a third point on the gas distribution device.

In further features, the substrate processing method further includes at least one of raising and lowering at least one of the first point, the second point, and the third point based on at least one of the first, second, and third distances.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

A substrate support, such as an electrostatic chuck, supports a substrate in a substrate processing chamber. A substrate is arranged on the substrate support during processing. Example processes that may be performed on a substrate include, but are not limited to, deposition (e.g., chemical vapor deposition (CVD), atomic layer deposition (ALD), plasma enhanced CVD (PECVD), plasma enhanced ALD (PEALD), etc.), etching, and cleaning.

A gas distribution device (e.g., a showerhead) distributes gas within the substrate processing chamber. Different processes may utilize different target orientations of the gas distribution device relative to the substrate support or relative to a substrate arranged on the substrate support. Different portions of a process may also utilize different target orientations.

A plurality of adjustment mechanisms may be configured to adjust the orientation of the gas distribution device. A controller may actuate the adjustment mechanisms to achieve the target orientation of the gas distribution device.

While processing is not being performed within the substrate processing chamber, one or more sensors may be used within the processing chamber to measure the orientation of the gas distribution device. Such sensors, however, are not suitable to measure the orientation of the gas distribution device during processing because temperature ratings of the sensors are less than temperatures within the substrate processing chamber during processing.

The orientation of the gas distribution device is different during processing than the orientation of the gas distribution device when processing is not being performed. This may be attributable to, for example, different components having different coefficients of thermal expansion and/or bowing of one or more components during processing.

According to the present disclosure, a distance sensor (e.g., a laser triangulation sensor) measures the distances between the gas distribution device and the substrate support while temperatures within the processing chamber are greater than or equal to a predetermined processing temperature (e.g., 80 degrees Celsius or greater). Based on the distances, the adjustment mechanisms may be adjusted to achieve the target orientation of the gas distribution device during processing. This may improve accuracy of the processing and the resulting substrates.

Figure 1:
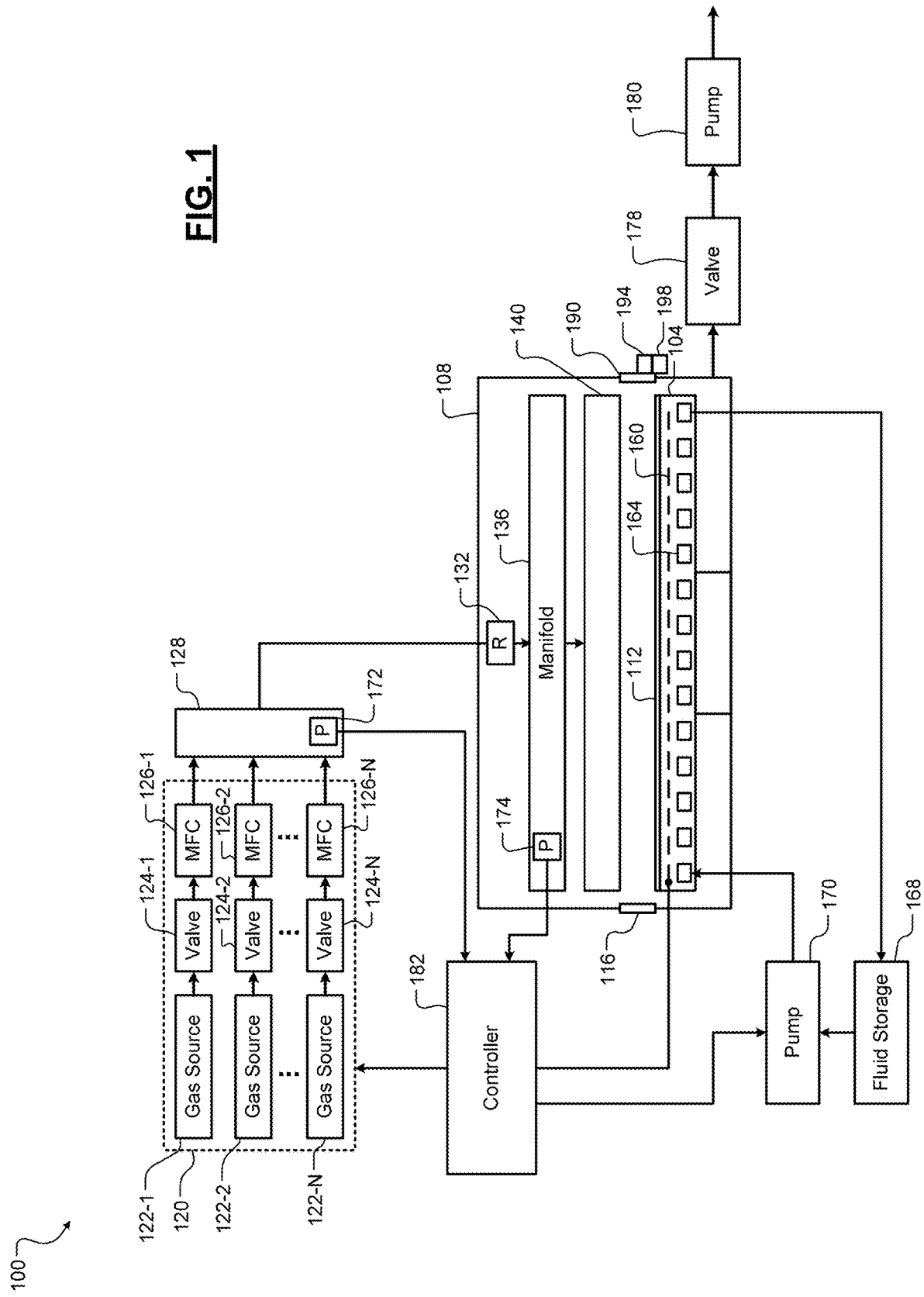
FIG. 1 is a functional block diagram of an example of a substrate processing system including a raisable and lowerable gas distribution device.

Referring now to FIG. 1, an example of a substrate processing system 100 including a substrate support 104 is shown. The substrate support 104 is arranged within a processing chamber 108. A substrate 112 is arranged on the substrate support 104 during processing of the substrate 112. Substrates are loaded into and unloaded from the processing chamber 108 via one or more doors, such as door 116.

A gas delivery system 120 includes gas sources 122-1, 122-2, . . . , and 122-N (collectively gas sources 122) that are connected to valves 124-1, 124-2, . . . , and 124-N (collectively valves 124) and mass flow controllers 126-1, 126-2, . . . , and 126-N (collectively MFCs 126). The MFCs 126 control flow of gases from the gas sources 122 to a manifold 128 where the gases mix.

An output of the manifold 128 is supplied via an optional pressure regulator 132 to a manifold 136. An output of the manifold 136 is input to a gas distribution device 140, such as a showerhead. The gas distribution device 140 distributes gas within the processing chamber 108. While the manifolds 128 and 136 are shown, a single manifold can be used. The manifold 136 may be integrated within the gas distribution device 140. The gas distribution device 140 is configured to be adjustable vertically and tiltable as described below in more detail.

In some examples, a temperature of the substrate support 104 (and therefore a temperature of the substrate 112) may be controlled using resistive heaters 160. The substrate support 104 may include coolant channels 164. Cooling fluid may be supplied to the coolant channels 164 from a fluid storage 168 and a pump 170. The cooling fluid may cool the substrate support (and therefore the substrate 112).

Pressure sensors 172 and 174 may be arranged in the manifold 128 or the manifold 136, respectively, and measure pressures. A valve 178 and a pump 180 may evacuate gases from the processing chamber 108 and/or control pressure within the processing chamber 108.

A controller 182 controls gas delivery from the gas delivery system 120 to the processing chamber 108, such as via the gas distribution device 140. The controller 182 controls pressure in the processing chamber and/or evacuation of reactants using the valve 178 and the pump 180. The controller 182 controls the temperature of the substrate support 104 and the substrate 112 based upon temperature feedback (e.g., from sensors (not shown) in the substrate support 104 and/or sensors (not shown) measuring coolant temperature).

The controller 182 also controls the orientation of the gas distribution device 140. More specifically, the controller 182 controls raising and lowering of the gas distribution device 140 to achieve target distances between the gas distribution device 140 and the substrate support 104.

A transparent window 190 is provided in a wall of the processing chamber 108. As discussed further below, a distance sensor 194 measures distances between the gas distribution device 140 and the substrate support 104 at multiple different locations while the processing chamber is heated to at least a predetermined processing temperature. The predetermined processing chamber may be, for example, 80 degrees Celsius or greater. An actuator 198 actuates the distance sensor 194 to measure the distances, as discussed further below.

Figure 2:
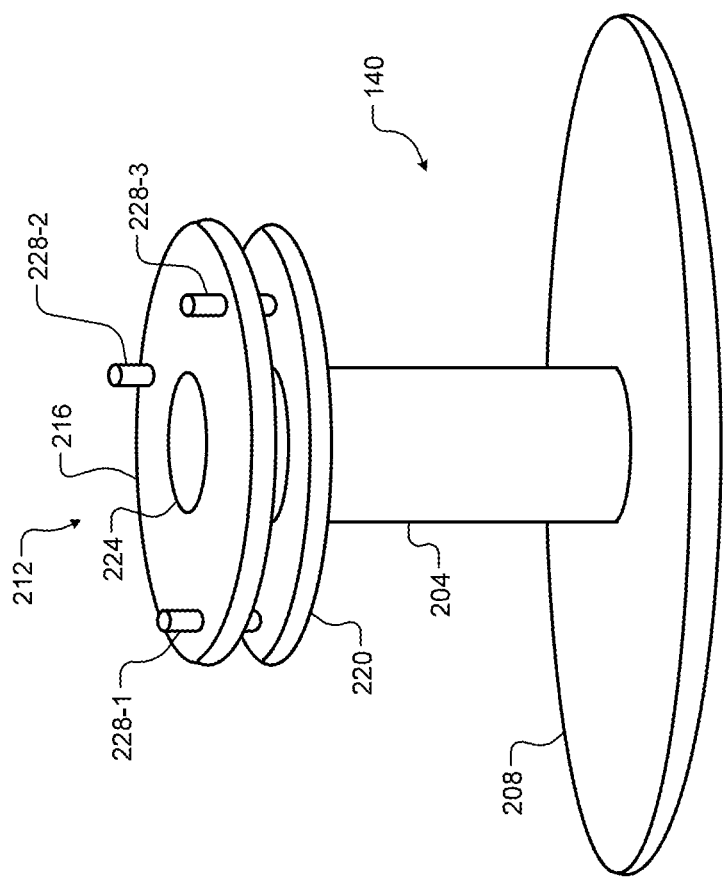
FIG. 2 is an example implementation of a raisable, lowerable, and tiltable gas distribution device.

Referring now to FIG. 2, a perspective view of an example implementation of the gas distribution device (e.g., a showerhead) 140 is provided. For example, the gas distribution device 140 may correspond to a three degrees-of-freedom (DOE) adjustable showerhead.

The gas distribution device 140 includes a stem portion 204 and a plasma-facing gas distribution plate (e.g., a faceplate) 208. The stem portion 204 is connected to an upper surface of the processing chamber 108 via a collar 212. For example, the collar 212 may include an upper plate 216 and a lower plate 220. The upper plate 216 is fixedly attached to the upper surface of the processing chamber 108. In some examples, the upper surface of the processing chamber 108 may serve as the upper plate 216. Process gases are provided to the gas distribution plate 208 via the stem portion 204 through an inlet 224.

The stem portion 204 is connected to the lower plate 220, and the lower plate 220 is tiltable, raisable, and lowerable relative to the upper plate 216. For example, the gas distribution device 140 may include adjustment mechanisms 228-1, 228-2, and 228-3 (collectively "adjustment mechanisms 228"). For example, the adjustment mechanisms 228 may correspond to screws, linear actuators, or another suitable type of actuator. In the example of screws, turning the screws causes the gas distribution device 140 to tilt, raise, or lower, thus changing the plane of the substrate facing surface of the gas distribution device 140. For example, turning the screws causes a distance between respective portions of the upper plate 216 and the lower plate 220 to increase and decrease, thereby causing the stem portion 204 and the gas distribution plate 208 to move accordingly. While the example of three adjustment mechanisms is provided, the gas distribution device 140 may include more than three adjustment mechanisms.

Figure 3A:
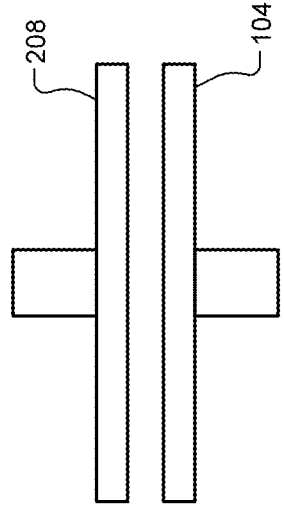
FIGS. 3A-3D include example illustrations of a raisable, lowerable, and tiltable gas distribution device in various orientations.
Figure 3B:
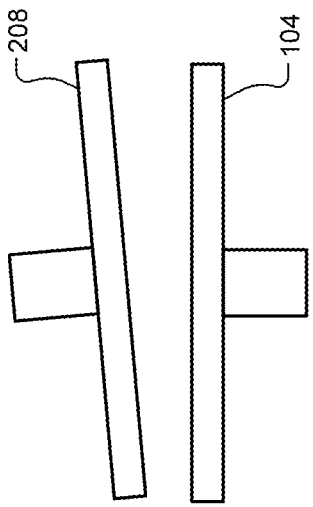

FIGS. 3A-3D include example illustrations of the gas distribution device 140 in various positions relative to the substrate support 104. In FIG. 3A the gas distribution device 140 is shown in a non-tilted position where the plane of the substrate facing surface of the gas distribution device 140 is parallel to the plane of the top surface of the substrate support 104. In FIG. 3A the adjustment mechanisms 228 may be adjusted such that the gas distribution device 140 is a maximum distance from the substrate support 104. Conversely, in FIG. 3B the adjustment mechanisms 228 may be adjusted such that the gas distribution device 140 is a minimum distance from the substrate support 104. In FIG. 3B, the gas distribution device 140 is shown in a non-tilted position where the plane of the substrate facing surface of the gas distribution device 140 is parallel to the plane of the top surface of the substrate support 104.

Figure 3C:
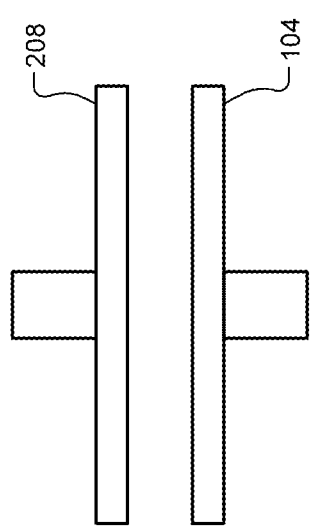
Figure 3D:
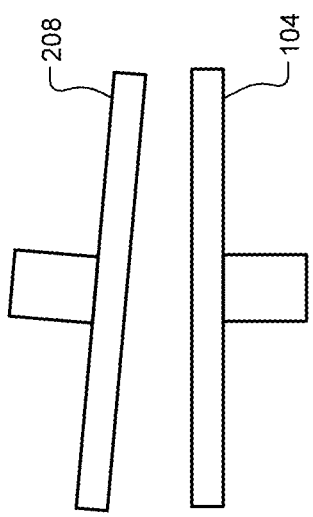

FIGS. 3C and 3D show the gas distribution device 140 in example tilted positions where the plane of the substrate facing surface of the gas distribution device 140 is non-parallel to the plane of the top surface of the substrate support 104. While the example of the gas distribution device 140 being located above the substrate support 104 is provided, the gas distribution device 140 may alternatively be located below the substrate support 104.

Figure 4:
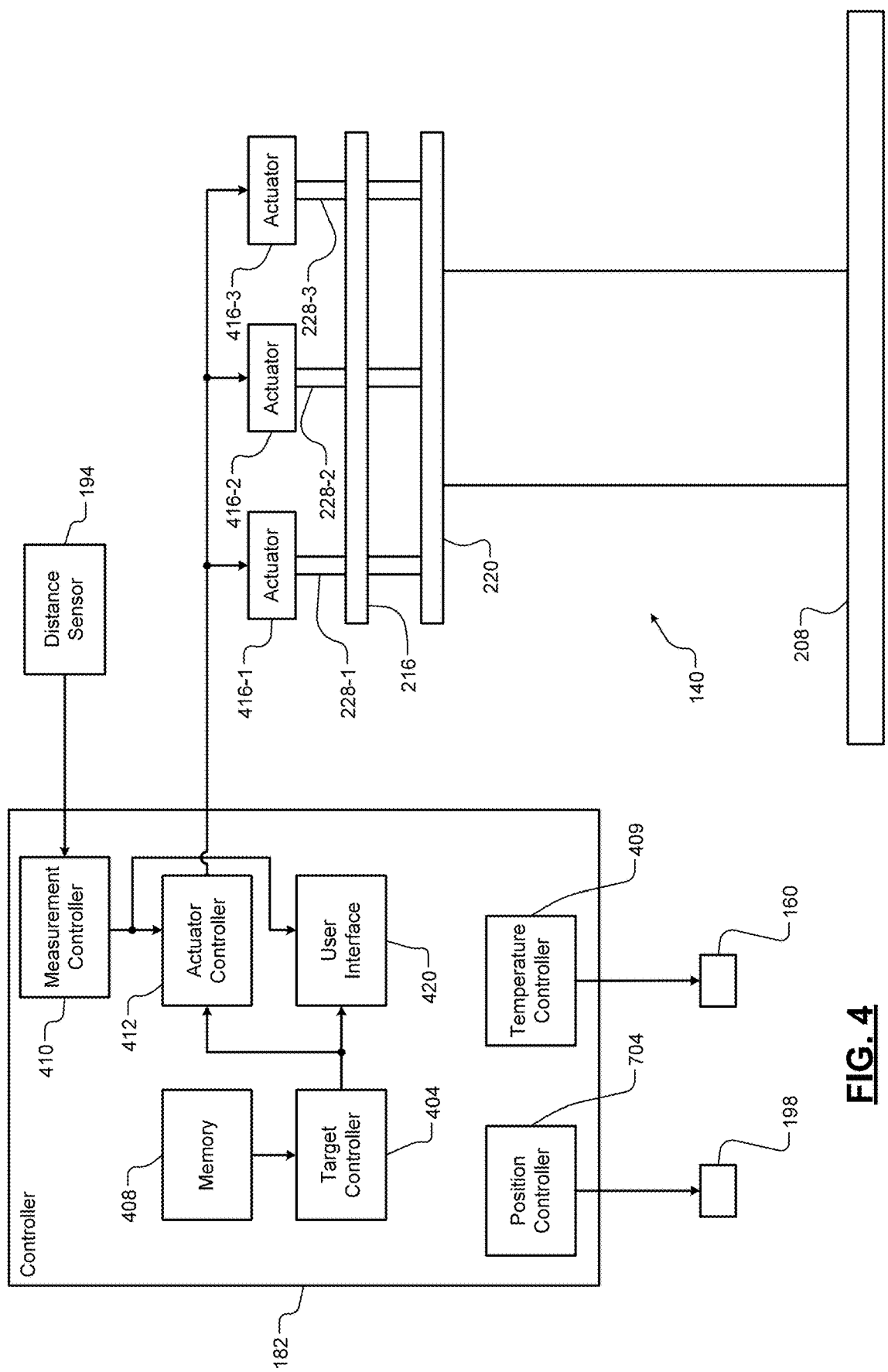
FIG. 4 is an example orientation control system.

FIG. 4 includes a functional block diagram of an example orientation control system. A target controller 404 may be configured to determine target distances between the gas distribution device 140 and the substrate support 104. For example, the target controller 404 may be configured to determine a first target distance between the gas distribution device 140 and the substrate support 104 at the location of the adjustment mechanism 228-1. The target controller 404 may also determine a second target distance between the gas distribution device 140 and the substrate support 104 at the location of the adjustment mechanism 228-2. The target controller 404 may also determine a third target distance between the gas distribution device 140 and the substrate support 104 at the location of the adjustment mechanism 228-3.

In various implementations, the first, second, and third target distances may be predetermined fixed values and may be stored in memory 408. Alternatively, the first, second, and third target distances may be variable and may be selected by the target controller 404, for example, for the process performed. Based on the process performed, the target controller 404 may select a set of the first, second, and third target distances from the memory 408. As an alternative to the target distances, target relationships between the plane of the substrate facing surface of the gas distribution device 140 and the plane of the top surface of the substrate support 104 may be used.

A temperature controller 409 controls heating and cooling of the processing chamber 108. For example, the temperature controller 409 may control heating via the heaters 160 and cooling via the cooling system including the pump 170.

While the temperature controller 409 has heated the processing chamber 108 such that a temperature within the processing chamber 108 is greater than or equal to a predetermined processing temperature, the distance sensor 194 measures a first distance between the gas distribution device 140 and the substrate support 104 at a first location. While the temperature within the processing chamber 108 is greater than or equal to the predetermined processing temperature, the distance sensor 194 also measures a second distance between the gas distribution device 140 and the substrate support 104 at a second location. While the temperature within the processing chamber 108 is greater than or equal to the predetermined processing temperature, the distance sensor 194 also measures a third distance between the gas distribution device 140 and the substrate support 104 at a third location. The predetermined processing temperature may be calibratable and may be, for example, greater than or equal to 80 degrees Celsius.

A measurement controller 410 determines the first, second, and third distances based on measurements from the distance sensor 194, as discussed further below. An actuator controller 412 may selectively actuate actuators 416-1, 416-2, and 416-3 (collectively "actuators 416") that actuate the adjustment mechanisms 228, respectively.

The actuator controller 412 may actuate the actuator 416-1 to adjust the first distance (measured using the distance sensor 194) to the first target distance. The actuator controller 412 may actuate the actuator 416-2 to adjust the second distance (measured using the distance sensor 194) to the second target distance. The actuator controller 412 may actuate the actuator 416-3 to adjust the third distance (measured using the distance sensor 194) to the third target distance.

The actuators 416 may include rotational actuators that are configured to rotate the adjustment mechanisms 228, respectively, in the example of the adjustment mechanisms 228 including screws. The actuators 416 may alternatively include linear actuators configured to linearly actuate the adjustment mechanisms 228 upward and downward in the example of the adjustment mechanisms 228 including pins or another type of linear actuator. The actuators 416, however, may be another type of actuator.

In various implementations, the actuators 416 may be omitted. The target controller 404 may display the first, second, and third target distances on a user interface 420 (e.g., a display). The measurement controller 410 may also display the first, second, and third distances measured using the distance sensor 194 on the user interface 420. A user may manually actuate the adjustment mechanisms 228 based on the information provided on the user interface 420.

Figure 5:
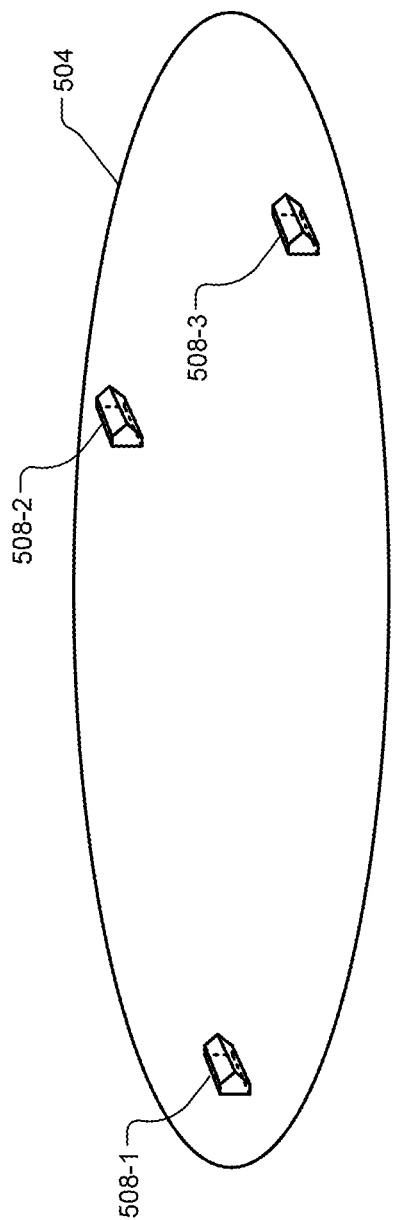
FIG. 5 is an illustration of an example measurement substrate.

The distance sensor 194 may measure the first, second, and third distances between the gas distribution device 140 and the substrate support 104 using a measurement substrate. FIG. 5 includes an example illustration of a measurement substrate 504.

The measurement substrate 504 includes first, second, and third measurement features 508-1, 508-2, and 508-3 (collectively "measurement features 508") at locations corresponding to the first, second, and third locations, respectively. Spacing between the measurement features 508 may be such that the measurement features 508 can be positioned directly (vertically) below the adjustment mechanisms 228, respectively. The controller 182 may control a robot to load the measurement substrate 504 onto the substrate support 104 such that the measurement features 508 are located vertically below the adjustment mechanisms 228, respectively. Alternatively, the measurement substrate 504 may be manually loaded onto the substrate support 104.

The first, second, and third measurement features 508 may be, for example, located on (e.g., adhered to) a top surface of the measurement substrate 504 or embedded in the measurement substrate 504. In various implementations, the measurement features 508 may be embedded in the measurement substrate 504 such that the measurement features 508 reflect light through the measurement substrate 504 and to the substrate support 104.

Figure 6:
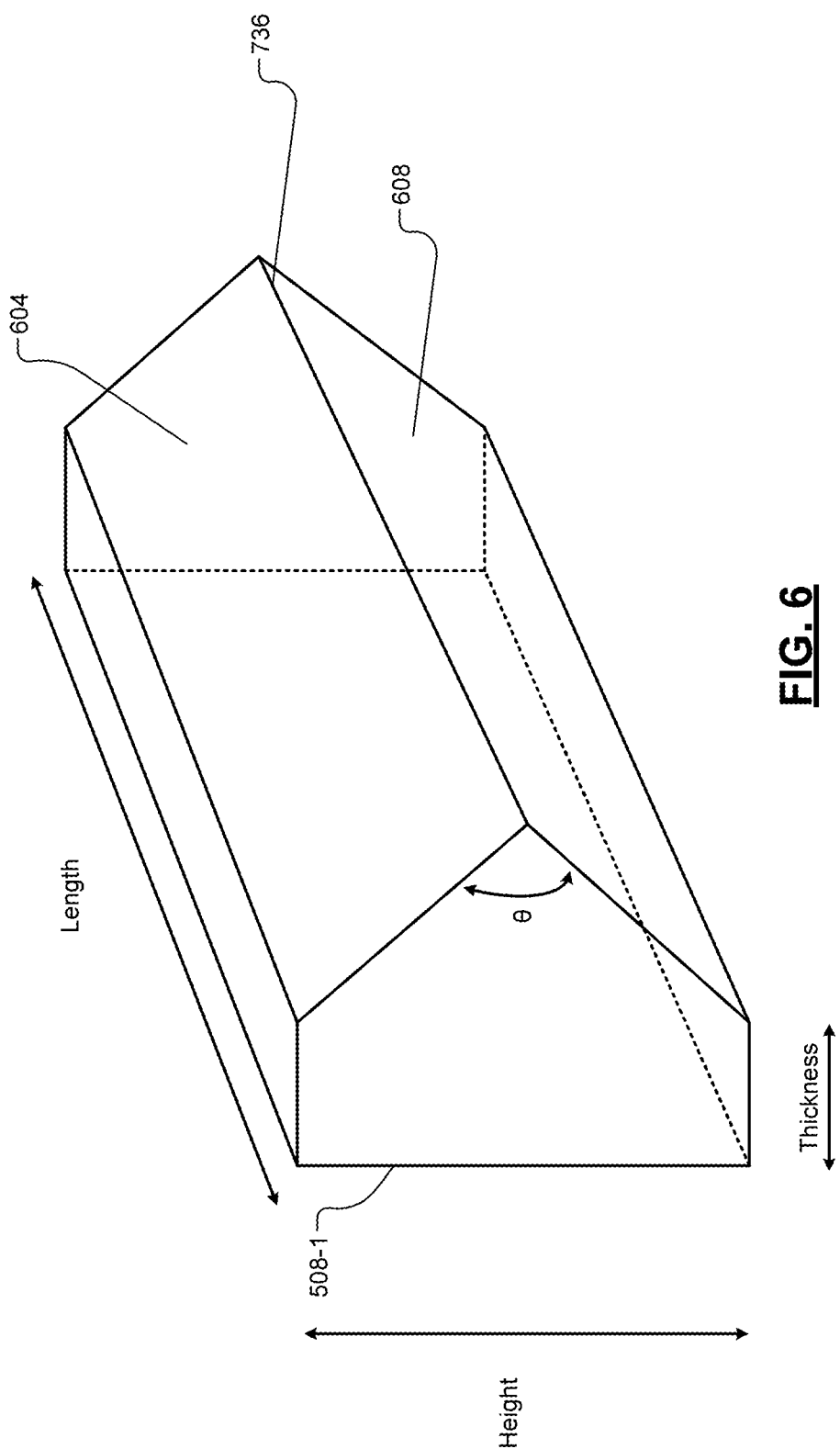
FIG. 6 is a side view of an example implementation of a measurement feature.

FIG. 6 includes a side view of an example implementation of the first measurement feature 508-1. The second and third measurement features 508-2 and 508-3 may be identical to the first measurement feature 508-1. The first, second, and third measurement features 508 may include knife edge prisms having a mirror coating on outer surfaces. The mirror coating is reflective at up to a predetermined distance and at up to a predetermined temperature. The predetermined distance may be, for example, 650 nanometers (nm) or another suitable distance. The predetermined temperature may be, for example, 650 degrees Celsius or another suitable temperature. For example, the mirror coating may include sapphire or another suitable material. While other dimensions and shapes may be used, the dimensions of the example implementation may be a height of 8 millimeters (mm), a thickness of 10 mm, a length of 12.5 mm, and an angle (θ) of 45 degrees. The examples illustrations may or may not be to scale. While one example is provided, the first, second, and third measurement features 508-1, 508-2, and 508-3 may have different shapes and/or dimensions.

The first, second, and third measurement features 508 are configured to reflect light in directions that are normal to the substrate facing surface of the gas distribution device 140 and the top surface of the substrate support 104 when the plane of the substrate facing surface of the gas distribution device 140 and the plane of the top surface of the substrate support 104 are parallel. For example, the first measurement feature 508-1 includes a first reflecting surface 604 and a second reflecting surface 608. The first reflecting surface 604 reflects received light toward the gas distribution device 140. The second reflecting surface 608 reflects light toward the substrate support 104.

Figure 7:
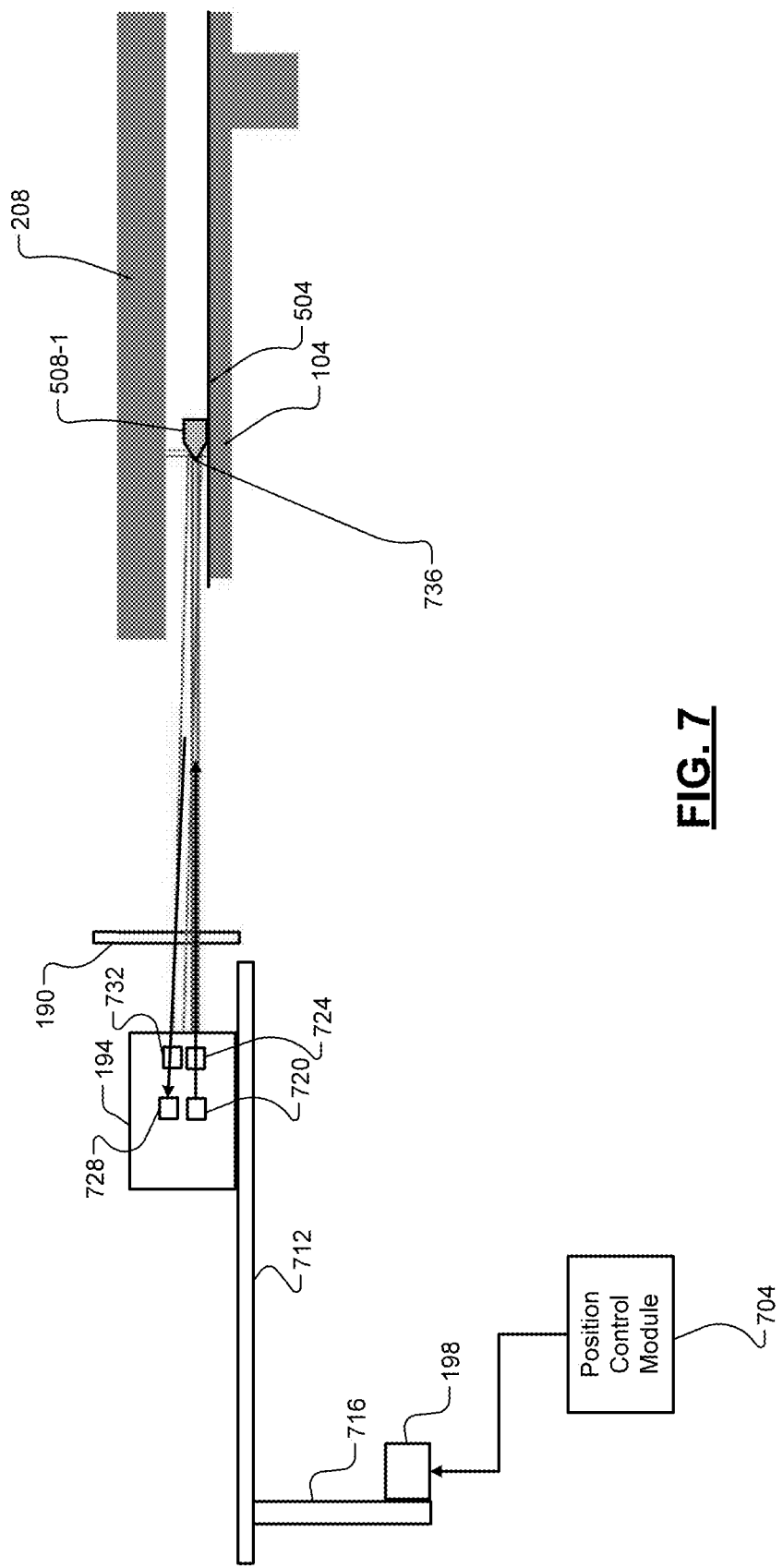
FIG. 7 is a side view of an example distance measurement system.

FIG. 7 includes a side view of an example distance measurement system. Only portions of the gas distribution plate 208, the substrate support 104, and the measurement substrate 504 are shown in FIG. 7 for simplicity.

The distance sensor 194 may include, for example, a laser triangulation sensor. For example only, the distance sensor 194 may be laser triangulation sensor model number LK-G502 by Keyence, laser triangulation sensor model number LK-G507 by Keyence, or another suitable triangulation sensor or another optical distance or displacement sensor. The distance sensor 194 may have a measurement resolution of less than one micron (μm), a measurement repeatability of less than 12.7 μm-3π, and a probe (light) spot size (e.g., diameter) of less than 1 mm within a distance of 1000 mm. While example characteristics are provided, the distance sensor 194 may have other suitable characteristics.

The actuator 198 actuates the distance sensor 194 to measure the first, second, and third distances. The actuator 198 is configured to raise and lower the distance sensor 194 and to rotate the distance sensor 194. The controller 182, such as a position controller 704, controls the actuator 198 and thereby controls positioning of the distance sensor 194.

For example, the distance sensor 194 may be implemented on a plate 712. The actuator 198 may rotate the plate 712 via a shaft 716 to rotate the distance sensor 194. The actuator 198 may raise and lower the plate 712 to raise and lower the distance sensor 194. In various implementations, a first actuator may raise and lower the distance sensor 194, and a second actuator may rotate the distance sensor 194.

The distance sensor 194 includes a light source 720, such as a solid state laser light source (e.g., a laser diode). The light source 720 outputs light (e.g., a laser beam) in a predetermined direction. In various implementations, the light source 720 may output light through a first lens 724.

Rotation of the distance sensor 194 sweeps the light output by the light source 720 left and right (rotationally). Movement of the distance sensor 194 up and down sweeps the light output by the light source 720 upward and downward vertically.

The distance sensor 194 also includes a detector 728 that outputs a distance between the distance sensor 194 and an object receiving light output by the light source 720 based on light reflected back to the distance sensor 194. More specifically, the detector 728 generates the distance based on a location on the detector 728 where the light is reflected back onto the detector 728 from the object. The detector 728 may include, for example, a complementary metal oxide semiconductor (CMOS) detector, a charge coupled device (CCD) detector, a position sensitive diode (PSD) detector, or another suitable type of detector. In various implementations, the reflected light may be provided onto the detector 728 via a second lens 732. The output light and the reflected light travel through the window 190 of the processing chamber 108.

To determine the first distance, the position controller 704 rotates the distance sensor 194 to output light to the first measurement feature 508-1. The position controller 704 may rotate the distance sensor 194 such that the distance sensor 194 outputs light in a direction that is perpendicular (normal) to a plane that extends vertically (perpendicularly) from a leading edge 736 of the first measurement feature 508-1. The position controller 704 also raises or lowers the distance sensor 194 such that the distance sensor 194 outputs light to one of: above the leading edge 736; and below the leading edge 736. After raising or lowering the distance sensor 194 to output light to the one of above the leading edge 736 and below the leading edge 736, the position controller 704 raises or lowers the distance sensor 194 such that the distance sensor 194 outputs light to other one of: above the leading edge 736; and below the leading edge 736.

Figure 8A:
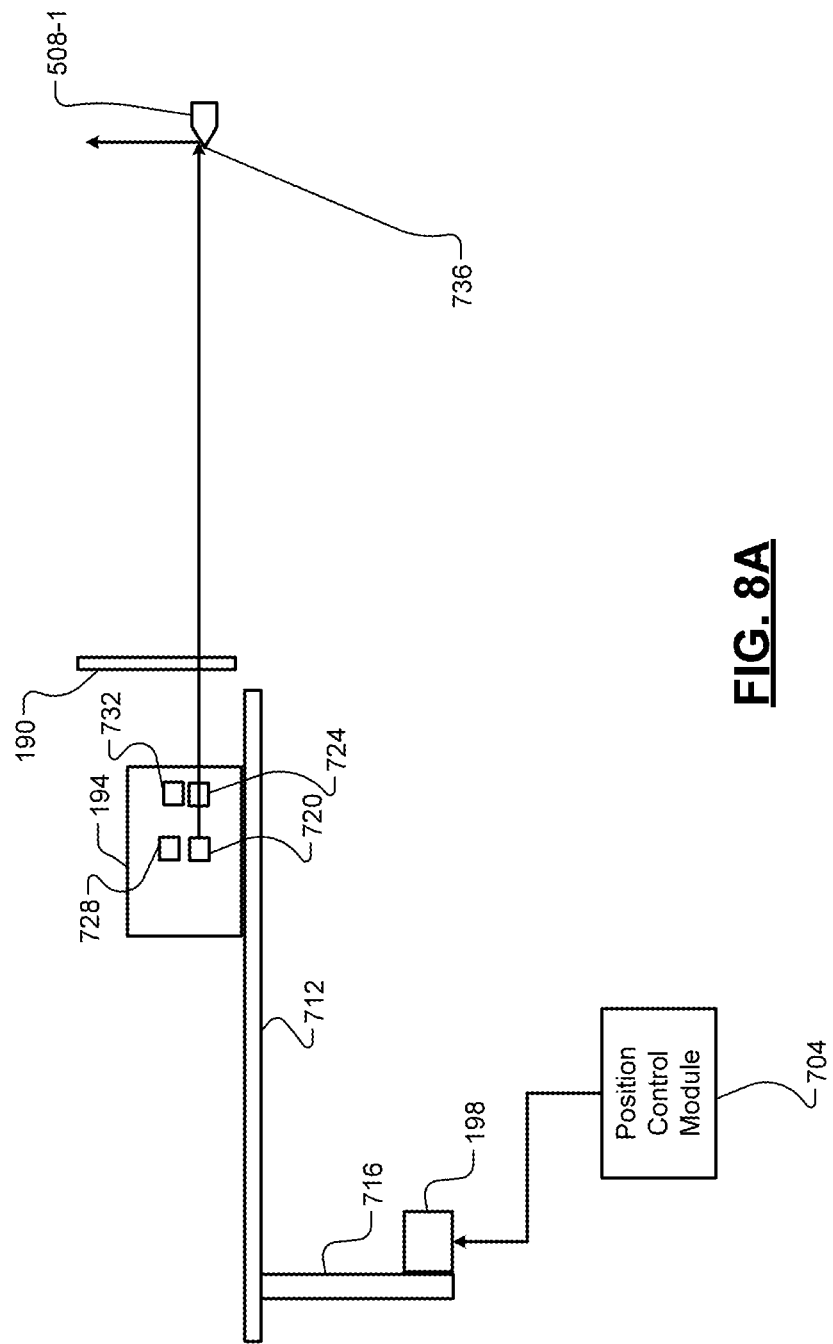
FIG. 8A is an example illustration of providing light above the leading edge of a measurement feature.
Figure 8B:
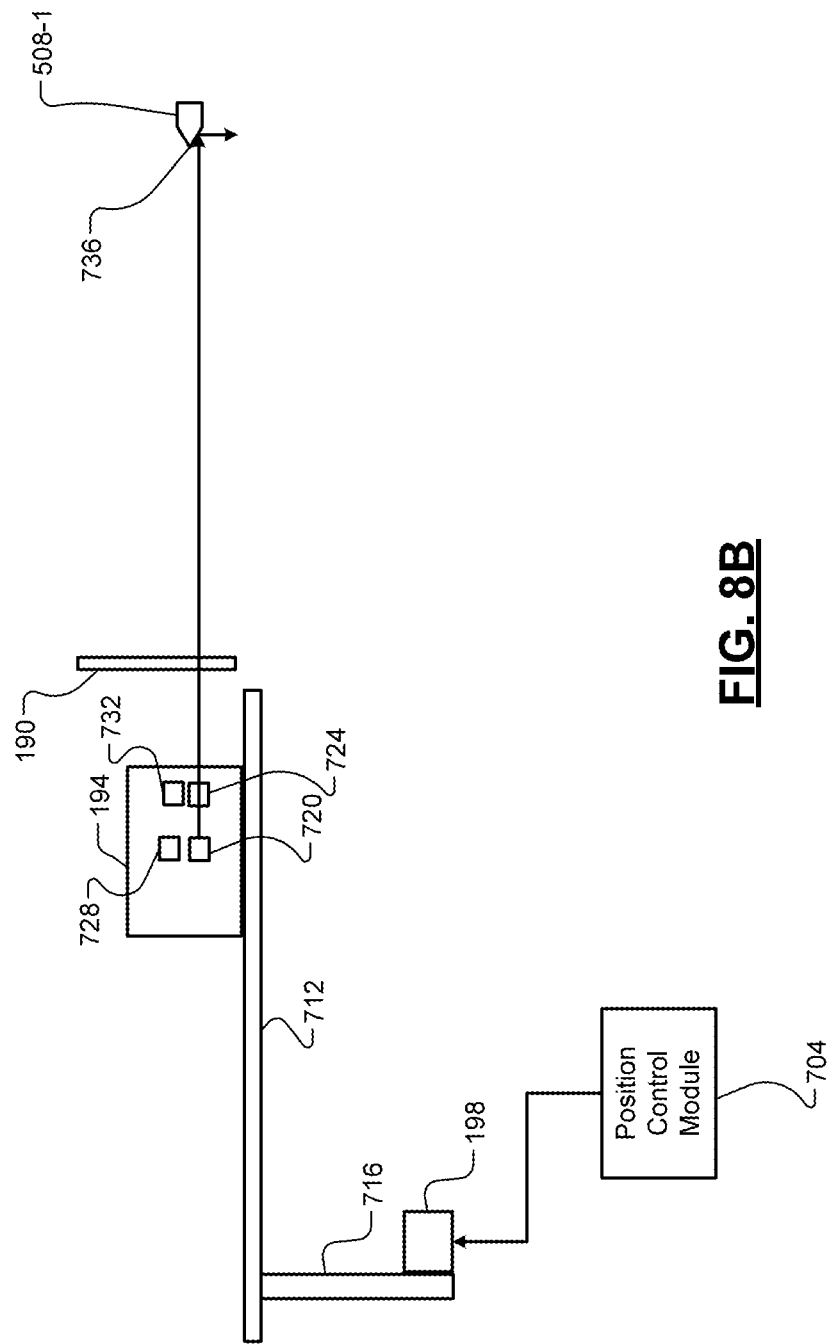
FIG. 8B includes an example illustration of providing light below the leading edge of the measurement feature.

FIG. 8A includes an example illustration of providing light above the leading edge 736. FIG. 8B includes an example illustration of light being provided below the leading edge 736.

When the light is output above the leading edge 736, the first measurement feature 508-1 reflects the light upward, and the distance sensor 194 measures an upward distance between the distance sensor 194 and the substrate facing surface of the gas distribution device 140. When the light is output to below the leading edge 736, the first measurement feature 508-1 reflects the light downward, and the distance sensor 194 measures a downward distance between the distance sensor 194 and a top surface of the measurement substrate 504 or the substrate support 104. If the measurement features 508 are arranged directly on the substrate support 104 or reflect light through the measurement substrate 504, when the light is output to below the leading edge 736, the measurement features 508 reflects the light downward, and the distance sensor 194 measures the downward distance between the distance sensor 194 and a top surface of the substrate support 104.

The measurement controller 410 receives the upward distance and the downward distance determined at the first measurement feature 508 from the distance sensor 194. The measurement controller 410 determines the first distance based on a difference between the upward distance and the downward distance. For example, the measurement controller 410 may set the first distance to the upward distance minus the downward distance.

Before or after positioning the distance sensor 194 to determine the first distance, the position controller 704 also determines the second distance using the second measurement feature 508-2 and the third distance using the third measurement feature 508-3. The position controller 704 determines the first, second, and third distances in any order. In the same way as was done with respect to the first measurement feature 508-1, the position controller 704 moves the distance sensor 194 to output light to the second and third measurement features 508-2 and 508-3 to determine the second and third distances, respectively. This involves rotating the distance sensor 194 to each of the second and third measurement features 508-2 and 508-3 and raising and lowering the distance sensor 194 to output light above and below the leading edges of the second and third measurement features 508-2 and 508-3.

Figure 9C:
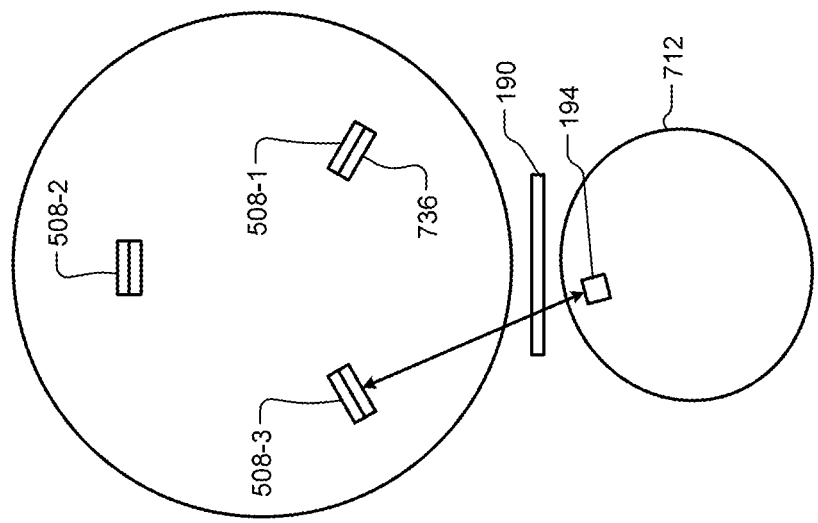
FIGS. 9A-9C include example illustrations of providing light to different measurement features.
Figure 9B:
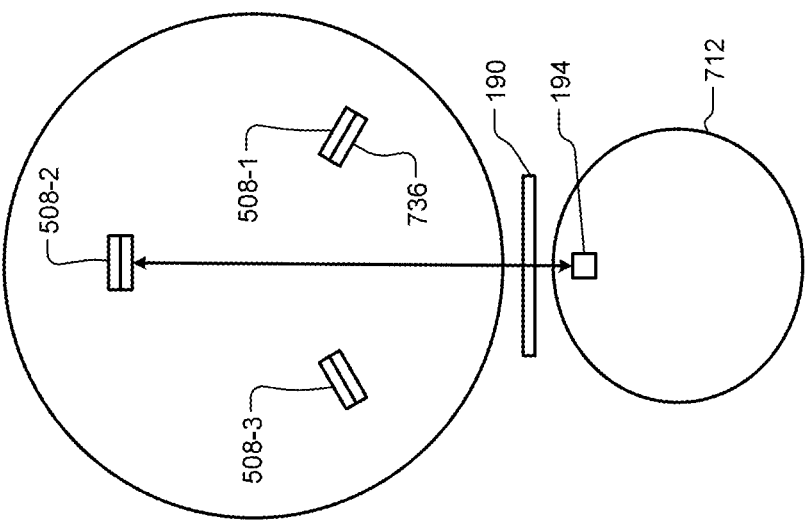
Figure 9A:
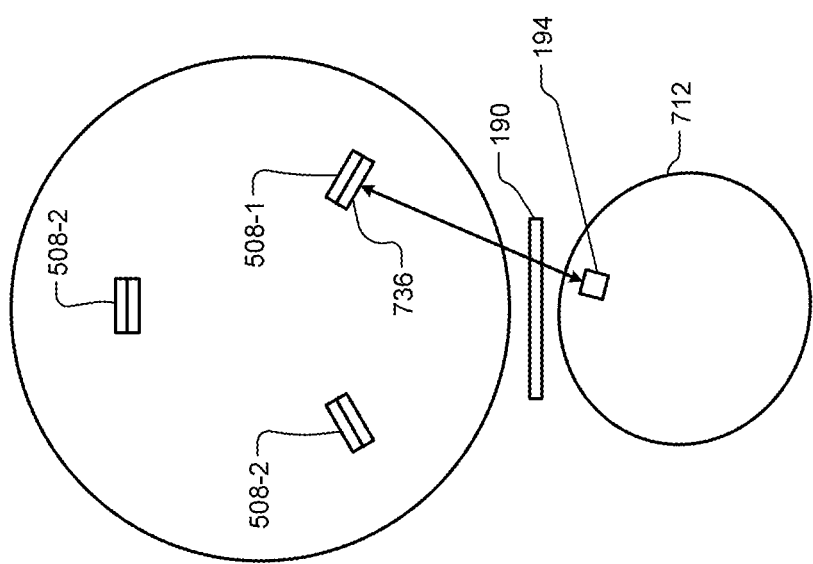

FIG. 9A includes an example top view illustration of the distance sensor 194 being rotated to face the first measurement feature 508-1 to measure the first distance. FIG. 9B includes an example top view illustration of the distance sensor 194 being rotated to face the second measurement feature 508-2 to measure the second distance. FIG. 9C includes an example top view illustration of the distance sensor 194 being rotated to face the third measurement feature 508-3 to measure the third distance.

Figure 10:
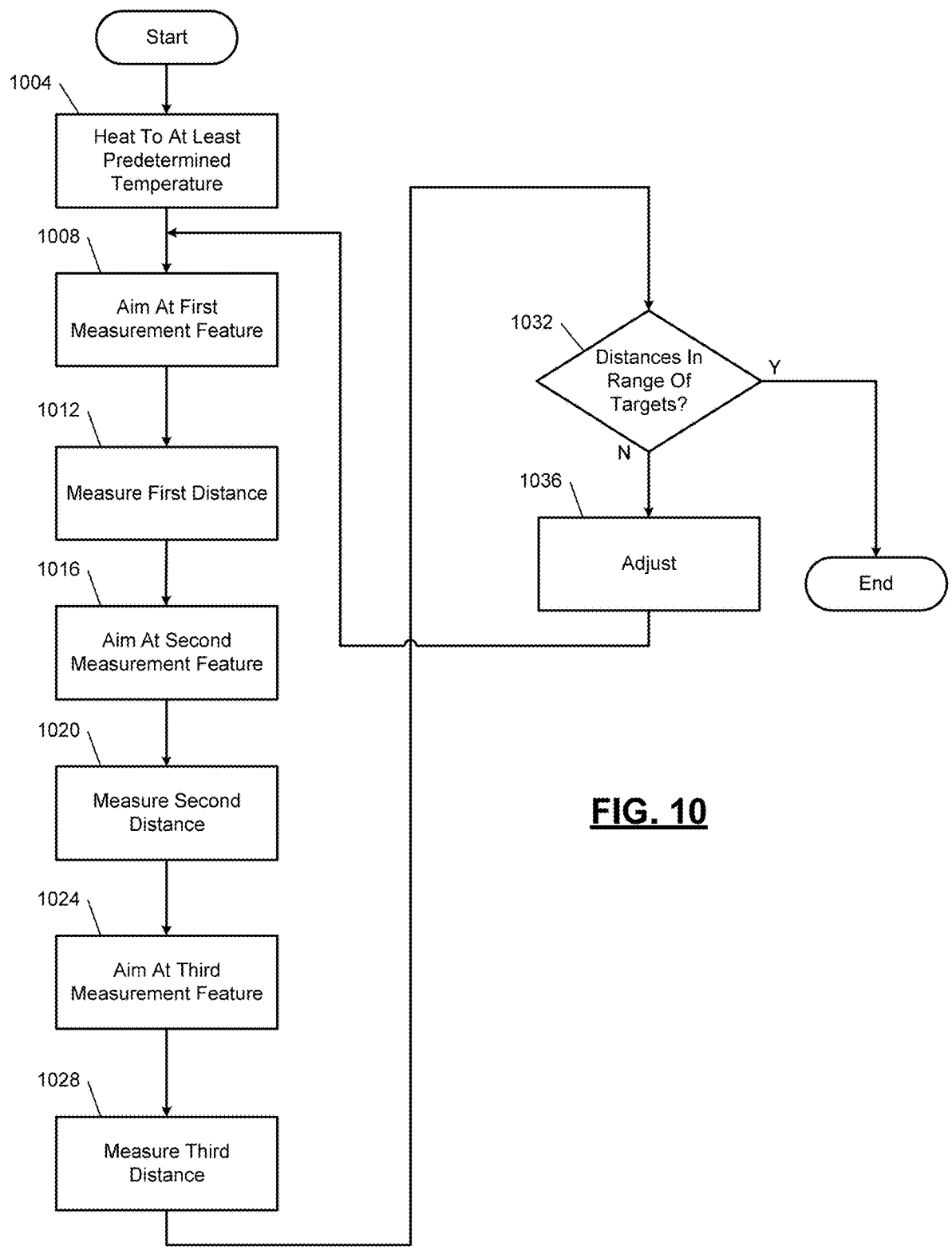
FIG. 10 includes a flowchart depicting an example method of determining distances between a gas distribution device and a substrate support at locations of measurement features.

FIG. 10 includes a flowchart depicting an example method of determining the first, second, and third distances and adjusting the gas distribution device 140 to first, second, and third target distances. Control begins when the measurement features 508 are arranged on the substrate support 104 within the processing chamber 108. The measurement features 508 may be positioned directly upon the substrate support 104 or located on or within the measurement substrate 504.

At 1004, the temperature controller 409 heats the processing chamber 108 (e.g., by applying power to the heaters 160) such that the temperature within the processing chamber 108 is greater than or equal to the predetermined processing temperature (e.g., 80 degrees Celsius). The temperature controller 409 maintains the temperature greater than or equal to the predetermined processing temperature until control ends.

At 1008, the position controller 704 actuates the actuator 198 to aim the light output by the distance sensor 194 at the first measurement feature 508-1. This includes aiming the light output by the distance sensor 194 above the leading edge of the first measurement feature 508-1 at a first time and aiming the light output by the distance sensor 194 below the leading edge 736 of the first measurement feature 508-1 at a second time. The distance sensor 194 measures the first upward distance when the light output by the distance sensor 194 is aimed above the leading edge 736 of the first measurement feature 508-1. The distance sensor 194 measures the first downward distance when the light output by the distance sensor 194 is aimed below the leading edge 736 of the first measurement feature 508-1. The position controller 704 actuates the actuator 198 to rotate the distance sensor 194 and to raise and lower the distance sensor 194.

At 1012, the measurement controller 410 determines the first distance between the substrate facing surface of the gas distribution device 140 and the substrate support 104 (or the measurement substrate 504) based on a difference between the first upward distance and the first downward distance. For example, the measurement controller 410 may set the first distance based on or equal to the first upward distance minus the first downward distance.

At 1016, the position controller 704 actuates the actuator 198 to aim the light output by the distance sensor 194 at the second measurement feature 508-2. This includes aiming the light output by the distance sensor 194 above the leading edge of the second measurement feature 508-2 at a third time and aiming the light output by the distance sensor 194 below the leading edge of the second measurement feature 508-2 at a fourth time. The distance sensor 194 measures the second upward distance when the light output by the distance sensor 194 is aimed above the leading edge of the second measurement feature 508-2. The distance sensor 194 measures the second downward distance when the light output by the distance sensor 194 is aimed below the leading edge of the second measurement feature 508-2. The position controller 704 actuates the actuator 198 to rotate the distance sensor 194 and to raise and lower the distance sensor 194.

At 1020, the measurement controller 410 determines the second distance between the substrate facing surface of the gas distribution device 140 and the substrate support 104 (or the measurement substrate 504) based on a difference between the second upward distance and the second downward distance. For example, the measurement controller 410 may set the second distance based on or equal to the second upward distance minus the second downward distance.

At 1024, the position controller 704 actuates the actuator 198 to aim the light output by the distance sensor 194 at the third measurement feature 508-3. This includes aiming the light output by the distance sensor 194 above the leading edge of the third measurement feature 508-3 at a fifth time and aiming the light output by the distance sensor 194 below the leading edge of the third measurement feature 508-3 at a sixth time. The distance sensor 194 measures the third upward distance when the light output by the distance sensor 194 is aimed above the leading edge of the third measurement feature 508-3. The distance sensor 194 measures the third downward distance when the light output by the distance sensor 194 is aimed below the leading edge of the third measurement feature 508-3. The position controller 704 actuates the actuator 198 to rotate the distance sensor 194 and to raise and lower the distance sensor 194.

At 1028, the measurement controller 410 determines the third distance between the substrate facing surface of the gas distribution device 140 and the substrate support 104 (or the measurement substrate 504) based on a difference between the third upward distance and the third downward distance. For example, the measurement controller 410 may set the third distance based on or equal to the third upward distance minus the third downward distance.

At 1032, the actuator controller 412 may determine whether the first, second, and third distances are all within a predetermined amount of the first, second, and third target distances, respectively. The predetermined amount may be calibrated and may be, for example, 1 μm or less. If 1032 is false, at 1036 the actuator controller 412 may adjust one or more of the adjustment mechanisms 228 to adjust the first, second, and third distances to within the predetermined amount of the first, second, and third target distances, respectively. Control may return to 1008. If 1032 is true, control may end.

In various implementations, 1032 may be omitted. The first, second, and third distances and the first, second, and third target distances may be displayed on the user interface 420. A user may manually adjust one or more of the adjustment mechanisms 228 to adjust the first, second, and third distances to within the predetermined amount of the first, second, and third target distances, respectively.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing system comprising:
a distance sensor configured to transmit and receive light through a window of an exterior wall of a substrate processing chamber; and
a controller configured to, while the distance sensor transmits light onto a measurement feature arranged between a first surface of a substrate support and a second surface of a gas distribution device, determine a first distance between the first and second surfaces based on a difference between:
a second distance between the distance sensor and the first surface measured using the distance sensor; and
a third distance between the distance sensor and the second surface measured using the distance sensor,
wherein the second surface faces the first surface.

2. The substrate processing system of claim 1 wherein the measurement feature is configured to:
reflect light from the distance sensor onto the first surface when the distance sensor outputs light to a first surface of the measurement feature; and
reflect light from the distance sensor onto the second surface when the distance sensor outputs light to a second surface of the measurement feature.

3. The substrate processing system of claim 1 wherein the measurement feature includes a knife edge prism including a mirror coating.

4. The substrate processing system of claim 1 wherein the controller is configured to increase a temperature within the substrate processing chamber greater than or equal to a predetermined processing temperature,
wherein the controller is configured to determine the first distance while the temperature is greater than or equal to the predetermined processing temperature.

5. The substrate processing system of claim 4 wherein the predetermined processing temperature is at least 80 degrees Celsius.

6. The substrate processing system of claim 1 further comprising:
an adjustment mechanism configured to raise and lower a portion of the gas distribution device.

7. The substrate processing system of claim 6 wherein the controller is configured to selectively actuate the adjustment mechanism based on the first distance.

8. The substrate processing system of claim 7 wherein the controller is configured to selectively actuate the adjustment mechanism to adjust the first distance toward a first target distance.

9. The substrate processing system of claim 1 wherein the controller is further configured to, while the distance sensor transmits light onto a second measurement feature arranged between the first surface of the substrate support and the second surface of the gas distribution device, determine a fourth distance between the first and second surfaces based on a second difference between:
a fifth distance between the distance sensor and the first surface measured using the distance sensor; and
a sixth distance between the distance sensor and the second surface measured using the distance sensor.

10. The substrate processing system of claim 9 wherein the controller is further configured to, while the distance sensor transmits light onto a third measurement feature arranged between the first surface of the substrate support and the second surface of the gas distribution device, determine a seventh distance between the first and second surfaces based on a third difference between:
an eighth distance between the distance sensor and the first surface measured using the distance sensor; and
a ninth distance between the distance sensor and the second surface measured using the distance sensor.

11. The substrate processing system of claim 10 further comprising:
a first adjustment mechanism configured to raise and lower a first point on the gas distribution device;
a second adjustment mechanism configured to, independently of the first adjustment mechanism, raise and lower a second point on the gas distribution device; and
a third adjustment mechanism configured to, independently of the first and second adjustment mechanisms, raise and lower a third point on the gas distribution device.

12. The substrate processing system of claim 11 wherein the controller is configured to selectively actuate at least one of the first, second, and third adjustment mechanisms based on at least one of the first, second, and third distances.

13. A substrate processing method comprising:
by a distance sensor, transmitting and receiving light through a window of an exterior wall of a substrate processing chamber; and
while the distance sensor transmits light onto a measurement feature arranged between a first surface of a substrate support and a second surface of a gas distribution device, determining a first distance between the first and second surfaces based on a difference between:
a second distance between the distance sensor and the first surface measured using the distance sensor; and
a third distance between the distance sensor and the second surface measured using the distance sensor,
wherein the second surface faces the first surface.

14. The substrate processing method of claim 13 further comprising, by the measurement feature:
reflecting light from the distance sensor onto the first surface when the distance sensor outputs light to a first surface of the measurement feature; and
reflecting light from the distance sensor onto the second surface when the distance sensor outputs light to a second surface of the measurement feature.

15. The substrate processing method of claim 13 wherein the measurement feature includes a knife edge prism including a mirror coating.

16. The substrate processing method of claim 13 further comprising increasing a temperature within the substrate processing chamber greater than or equal to a predetermined processing temperature,
wherein the determining the first distance includes determining the first distance while the temperature is greater than or equal to the predetermined processing temperature.

17. The substrate processing method of claim 16 wherein the predetermined processing temperature is at least 80 degrees Celsius.

18. The substrate processing method of claim 13 further comprising:
raising and lowering a portion of the gas distribution device.

19. The substrate processing method of claim 18 wherein the raising and lowering includes at least one of raising and lowering the portion of the gas distribution device based on the first distance.

20. The substrate processing method of claim 19 wherein the raising and lowering includes at least one of raising and lowering the portion of the gas distribution device to adjust the first distance toward a first target distance.

21. The substrate processing method of claim 13 further comprising, while the distance sensor is transmitting light onto a second measurement feature arranged between the first surface of the substrate support and the second surface of the gas distribution device, determining a fourth distance between the first and second surfaces based on a second difference between:
a fifth distance between the distance sensor and the first surface measured using the distance sensor; and
a sixth distance between the distance sensor and the second surface measured using the distance sensor.

22. The substrate processing method of claim 21 further comprising, while the distance sensor is transmitting light onto a third measurement feature arranged between the first surface of the substrate support and the second surface of the gas distribution device, determine a seventh distance between the first and second surfaces based on a third difference between:
- an eighth distance between the distance sensor and the first surface measured using the distance sensor; and
- a ninth distance between the distance sensor and the second surface measured using the distance sensor.

23. The substrate processing method of claim 22 further comprising:
- raising and lowering a first point on the gas distribution device;
- independently of the first point, raising and lowering a second point on the gas distribution device; and
- independently of the first and second points, raising and lowering a third point on the gas distribution device.

24. The substrate processing method of claim 23 further comprising at least one of raising and lowering at least one of the first point, the second point, and the third point based on at least one of the first, second, and third distances.

* * * * *